US012249479B2

(12) United States Patent
Otsuki et al.

(10) Patent No.: US 12,249,479 B2
(45) Date of Patent: Mar. 11, 2025

(54) SUBSTRATE HOLDING DEVICE

(71) Applicant: Nissin Ion Equipment Co., Ltd., Kyoto (JP)

(72) Inventors: Yusuke Otsuki, Shiga (JP); Masatoshi Onoda, Shiga (JP); Ippei Nishimura, Shiga (JP)

(73) Assignee: Nissin Ion Equipment Co., Ltd., Minami-Ku (JP)

( * ) Notice: Subject to any disclaimer, the term of this patent is extended or adjusted under 35 U.S.C. 154(b) by 412 days.

(21) Appl. No.: 17/871,108

(22) Filed: Jul. 22, 2022

(65) Prior Publication Data

US 2023/0140269 A1 May 4, 2023

(30) Foreign Application Priority Data

Nov. 1, 2021 (JP) ................................ 2021-178555

(51) Int. Cl.
*H01J 37/20* (2006.01)
*H01J 37/317* (2006.01)

(52) U.S. Cl.
CPC .......... *H01J 37/20* (2013.01); *H01J 37/3171* (2013.01); *H01J 2237/20214* (2013.01); *H01J 2237/20278* (2013.01)

(58) Field of Classification Search
CPC ................... H01J 37/20; H01J 37/3171; H01J 2237/20214; H01J 2237/20278; H01J 2237/20207; H01J 37/244; H01J 37/3002
See application file for complete search history.

(56) References Cited

U.S. PATENT DOCUMENTS

| 6,403,968 B1 * | 6/2002 | Hazaki .................... H01J 37/20 250/442.11 |
| 2017/0117117 A1 * | 4/2017 | Ishikawa ................. H01J 37/20 |

FOREIGN PATENT DOCUMENTS

JP  2004-095434  3/2004

* cited by examiner

*Primary Examiner* — David A Vanore
(74) *Attorney, Agent, or Firm* — Amin, Turocy & Watson, LLP

(57) ABSTRACT

Provided is a substrate holding device comprising: a holder that holds a substrate irradiated with an ion beam; and a driving device that rotates the holder around a predetermined axis to change an inclination of the held substrate with respect to the ion beam, wherein the driving device comprises: a power source that outputs power to rotate the holder; a reduction gear provided in the middle of a power transmission path from the power source to the holder; a first shaft member that rotates together with the holder by a power outputted from the reduction gear; a first detector that detects a rotational motion of the first shaft member; and a power control device that controls the power source based on a detection value of the first detector.

6 Claims, 5 Drawing Sheets

SUBSTRATE HOLDING DEVICE

CROSS-REFERENCE TO RELATED APPLICATION

This application claims priority from Japanese Patent Application No. JP 2021-178555, filed Nov. 1, 2021 in the Japanese Patent Office, the entire contents of which is incorporated by reference herein in its entirety.

BACKGROUND

1. Field

The present disclosure relates to a substrate holding device that holds a substrate irradiated with an ion beam.

2. Description of Related Art

The ion beam irradiation device incorporates a substrate holding device that holds a substrate irradiated with an ion beam. Some of the substrate holding device include a holder that holds a substrate irradiated with an ion beam, and a driving device that rotates the holder to change the inclination of the substrate held by the holder with respect to the ion beam.

Such driving device is configured for capable of precisely controlling the inclination of the substrate by controlling, for example, a direct drive motor directly connected to the holder.

However, in this configuration, an attempt to output a high torque in order to rotate the holder causes an increase in size and cost of the direct motor. On the other hand, when a reduction gear is used to reduce the size of a motor, it would be difficult to precisely control the inclination of a substrate due to wear of a gear, backlash, or the like.

SUMMARY

One embodiment of the substrate holding device comprises a holder that holds a substrate irradiated with an ion beam, and a driving device that rotates the holder about a predetermined axis to change an inclination of the held substrate with respect to the ion beam. In this substrate holding device, the driving device comprises a power source that outputs power to rotates the holder, a reduction gear provided in the middle of a power transmission path from the power source to the holder, a first shaft member that rotates together with the holder by the power outputted from the reduction gear, a first detector that detects a rotational motion of the first shaft member, and a power control device that controls the power source based on a detection value of the first detector.

Here, "detects a rotational motion of the first shaft member" is a concept including not only the meaning of directly detecting the rotational motion of the first shaft member, but also the meaning of detecting the rotational motion of the member rotating in synchronization with the first shaft member as the rotational motion of the first shaft member.

In addition, in the present specification, "rotating in synchronization" means rotating at the same angular velocity.

One embodiment of the substrate holding device further includes a plurality of transmission gears interposed between the power source and the first shaft member.

One embodiment of the substrate holding device may further include a second detector that detects a rotational motion of the output shaft of the power source, and a monitoring device that compares a detection value of the first detector and a detection value of the second detector to determine whether an abnormality has occurred in the driving device.

Here, "detects a rotational motion of the output shaft" is a concept including not only the meaning of directly detecting the rotational motion of the output shaft, but also the meaning of detecting the rotational motion of a member rotating in synchronization with the output shaft as the rotational motion of the output shaft.

By comparing such detection values, it is possible to detect or judge an abnormality based on a difference in rotational motion between the output shaft of the power source and the first shaft member, and it is possible to allow the monitoring device to monitor, for example, a gear damage, a gear replacement timing due to an amount of wear exceeding a specified value, and the like.

In one embodiment of the substrate holding device, the first detector detects a change in a magnetic field caused by a rotating operation of the first shaft member.

BRIEF DESCRIPTION OF THE DRAWINGS

The above and/or other aspects will become apparent and more readily appreciated from the following description of example embodiments, taken in conjunction with the accompanying drawings of which.

DETAILED DESCRIPTION

Hereinafter, an embodiment of a substrate holding device according to the present disclosure is described with reference to the drawings.

Figure 1:
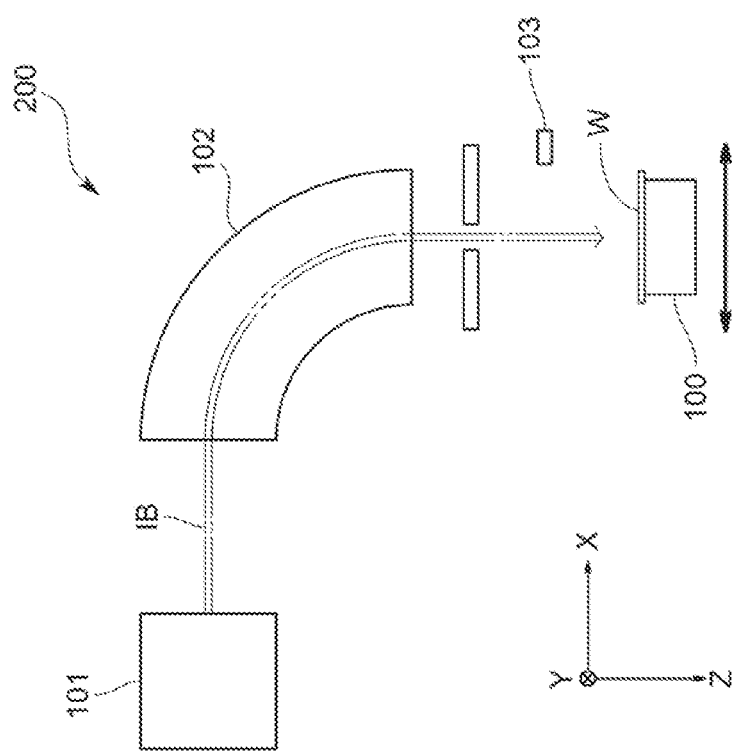
FIG. 1 is a schematic diagram showing an overall configuration of an ion beam irradiation device according to an embodiment.

As shown in FIG. 1, the substrate holding device 100 of the present embodiment is incorporated in an ion beam irradiation device 200.

First, the ion beam irradiation device 200 is briefly described.

The ion beam irradiation device 200 is an ion implantation device for irradiating a surface of a substrate W such as a semiconductor wafer with an ion beam IB, injecting ions into the substrate W, and imparting the desired characteristics to the substrate W. The ion beam irradiation device 200 is not limited to the ion implantation device, and may be, for example, an ion beam etching device or the like.

The ion beam irradiation device 200 performs mass analysis of the ion beam IB extracted from the ion source 101 by the mass analyzer 102, and then irradiates the substrate W held by the substrate holding device 100 with the ion beam IB to inject a desired ion species into the substrate W. The path of the ion beam from the ion source 101 to the substrate holding device 100 is surrounded by a vacuum vessel (not shown), and is maintained in a vacuum during ion implantation.

The ion beam irradiation device 200 includes a PFG (plasma flood gun) 103 that supplies electrons to the ion beam IB or the surface of the substrate W in order to suppress charging of the surface of the substrate W.

The ion beam IB in the present embodiment is a ribbon beam or a sheet beam. That is, the ion beam IB in this embodiment has a band shape that is long in one direction and has a thickness in a direction orthogonal to the length direction. In the present embodiment, the traveling direction of the ion beam IB is defined as a Z direction, and two directions substantially orthogonal to each other in a plane substantially orthogonal to the Z direction are defined as an X direction and a Y direction. For example, the X direction is the thickness direction of the ion beam IB, the Y direction is the length direction of the ion beam IB, the X direction and the Z direction are the horizontal direction, and the Y direction is the vertical direction. The Y direction is a fixed direction, but the X direction and the Z direction are not absolute directions but change along the traveling direction of the ion beam IB. However, the ion beam IB is not limited to a ribbon beam, and may be a spot beam.

The substrate W held by the substrate holding device 100 is scanned in the X direction in a manner to cross the ion beam IB along the thickness direction. Thus, the ion beam IB is irradiated on the entire surface of the substrate W. The scanning direction of the substrate W may also be the Y direction.

Next, the substrate holding device 100 will be described.

Figure 2:
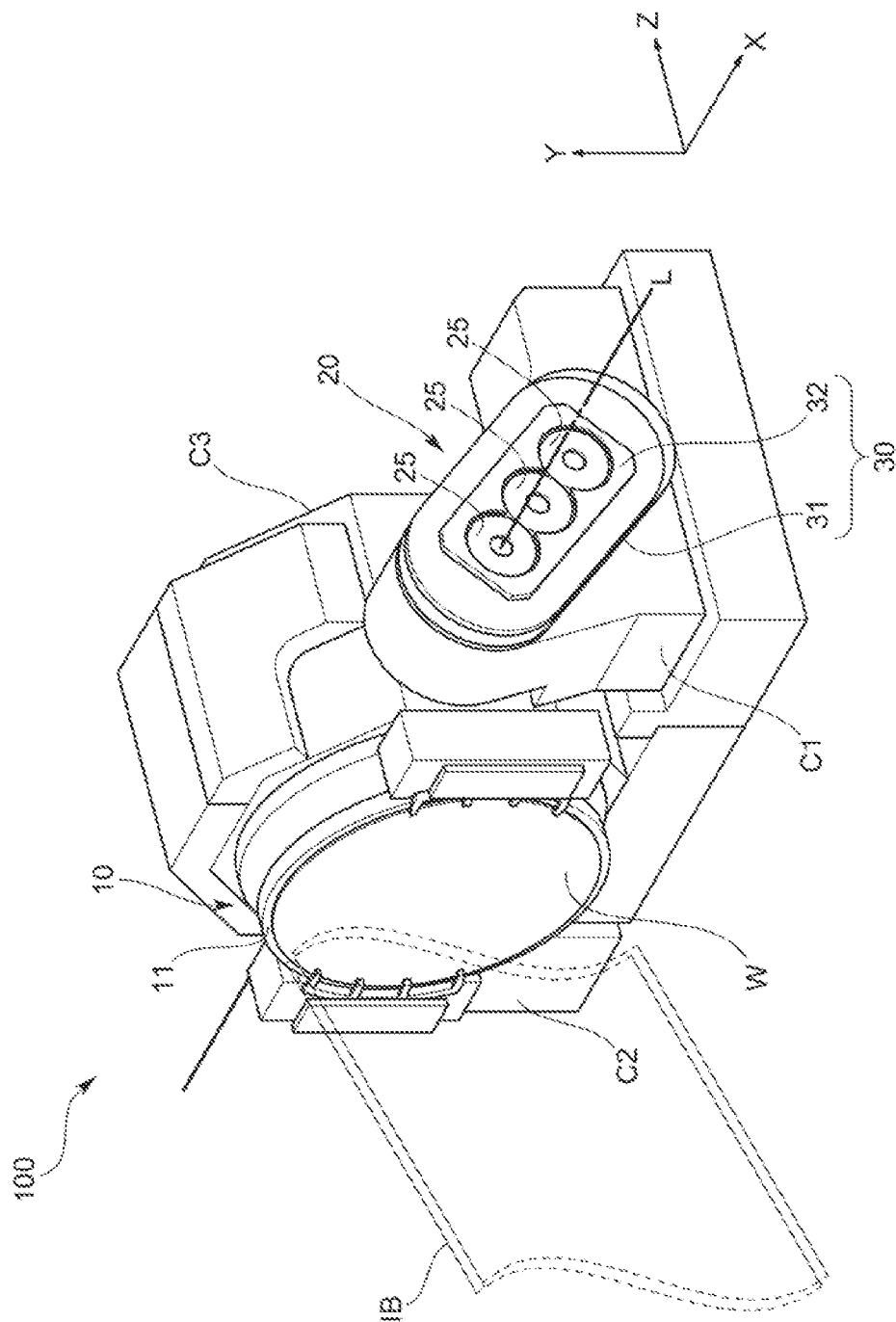
FIG. 2 is a perspective view showing a configuration of the substrate holding device according to an embodiment.

As shown in FIG. 2, the substrate holding device 100 includes a holder 10 for holding a substrate W and a driving device 20 for driving the holder 10.

The holder 10 is configured to be rotatable, and is switched from the fallen state to the upright state or switched from the upright state to the fallen state by rotating. First, when the holder 10 is in the fallen state, the substrate W is placed on the holder 10. Thereafter, the holder 10 is rotated while holding the mounted substrate W, thereby the holder 10 is brought into an upright posture. When the holder 10 is in an upright state, the substrate W held by the holder 10 is irradiated with the ion beam IB. FIG. 2 shows the holder 10 in an upright state.

The driving device 20 can change the inclination of the substrate W held by the holder 10 with respect to the ion beam IB by rotating the holder 10 around a predetermined rotation axis L.

The "inclination of the substrate W with respect to the ion beam IB" is an angle formed by a normal line of the surface of the substrate W and a traveling direction of the ion beam IB, and is also referred to as a tilt angle.

The rotation axis L of the holder 10 is set parallel to the substrate mounting surface 11 of the holder 10, and is set in the X direction in FIG. 2, that is, set along the thickness direction of the ion beam IB immediately before irradiating on the substrate W. However, the rotation axis L of the holder 10 may also be set along the Y direction.

In the present embodiment, as shown in FIG. 2, a first casing C1 and a second casing C2 are provided at positions sandwiching the holder 10, and a third casing C3 is provided on the rear surface side of the holder 10 opposite to the substrate mounting surface 11.

Figure 3:
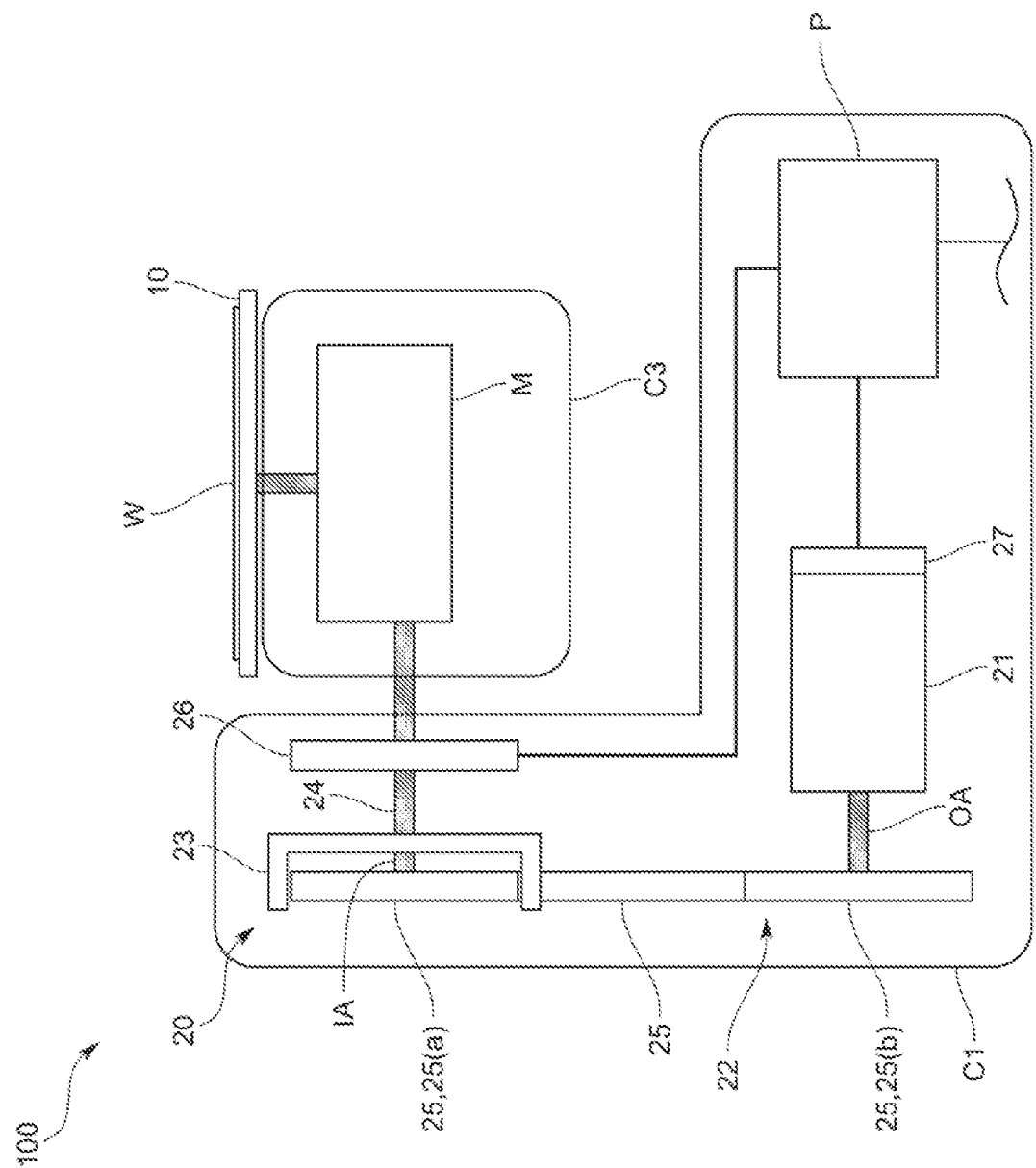
FIG. 3 is a schematic view showing a configuration of a substrate holding device according to the embodiment.

In the present embodiment, as shown in FIG. 3, the components of the driving device 20 are mainly accommodated in the first casing C1. Further, the second casing C2 accommodates a power supply cable used for rotating the holder 10 around an axis along a normal line direction of the substrate mounting surface 11, various wires and pipes such as a pipe member through which cooling water flows, and the like, and the third casing C3 accommodates a twist motor M and the like for rotating the holder 10 around an axis along a normal line direction of the substrate mounting surface 11.

The present invention is characterized by the driving device 20 and is described in detail below.

As shown in FIG. 3, the driving device 20 includes a power source 21 for rotating the holder 10, and a power transmission unit 22 for transmitting power from the power source 21 to the holder 10.

The power source 21 in the present embodiment is an electric motor, and a servomotor capable of controlling a rotation angle (rotational position) is used here. However, the present invention is not necessarily limited to this, and various types of power sources may be used.

The power transmission unit 22 forms a power transmission path from the power source 21 to the holder 10, and specifically, includes at least a reduction gear 23 provided in the middle of the power transmission path and a first shaft member 24 connected to the holder 10.

The reduction gear 23 reduces the rotational speed by using a plurality of gears, amplifies the input torque to a torque proportional to the speed reduction ratio, and outputs the amplified torque. Specifically, the reduction gear 23 may be, for example, a harmonic drive (registered trademark). However, the reduction gear 23 is not necessarily limited to this, and various types may be used.

The first shaft member 24 rotates by the power (torque) outputted from the reduction gear 23 and rotates the holder 10. The first shaft member 24 is formed by the output shaft of the reduction gear 23 in the present embodiment. The first shaft member 24 may be the output shaft itself of the reduction gear 23 as in the present embodiment, or may be a shaft member different from the reduction gear 23 interposed between the reduction gear 23 and the holder 10.

More specifically, when the first shaft member 24 rotates, the holder 10 rotates around the rotation axis L in synchronization with the rotation. In other words, the first shaft member 24 rotates the holder 10 during adjustment of the tilt angle.

The first shaft member 24 of the present embodiment may be a member which is separate from the output shaft of the reduction gear 23 and rotates in synchronization with the output shaft of the reduction gear 23 to rotate the holder 10. When the first shaft member 24 is a shaft member different from the output shaft of the reduction gear 23, the first shaft member 24 need not always rotate in synchronization with the output shaft of the reduction gear 23 depending on the configuration of the power transmission path, for example, a configuration in which a gear is interposed between the reduction gear 23 and the holder 10. In this case, the first shaft member 24 may be any member that rotates at least the holder 10 in synchronization.

The first shaft member 24 integrally rotates the holder 10 and the twist motor M, and passes through the first casing C1 and the third casing C3.

In the present embodiment, an annular seal member (not shown) such as a lip seal is provided around the first shaft member 24, and a space between the first casing C1 and the third casing C3 is sealed by the seal member.

Thus, during ion implantation into the substrate W, the inside of the first casing C1 communicates with the atmosphere, and the inside of the third casing C3 maintains in the vacuum atmosphere. The second casing C2 maintains in a vacuum atmosphere during ion implantation into the substrate W.

In this configuration, the first casing C1 accommodates the reduction gear 23 constituting the power transmission unit 22, other various components and the power source 21.

As shown in FIGS. 2 and 3, the power transmission unit 22 of the present embodiment further includes a plurality of transmission gears 25 provided in the middle of the power transmission path.

Figure 4:
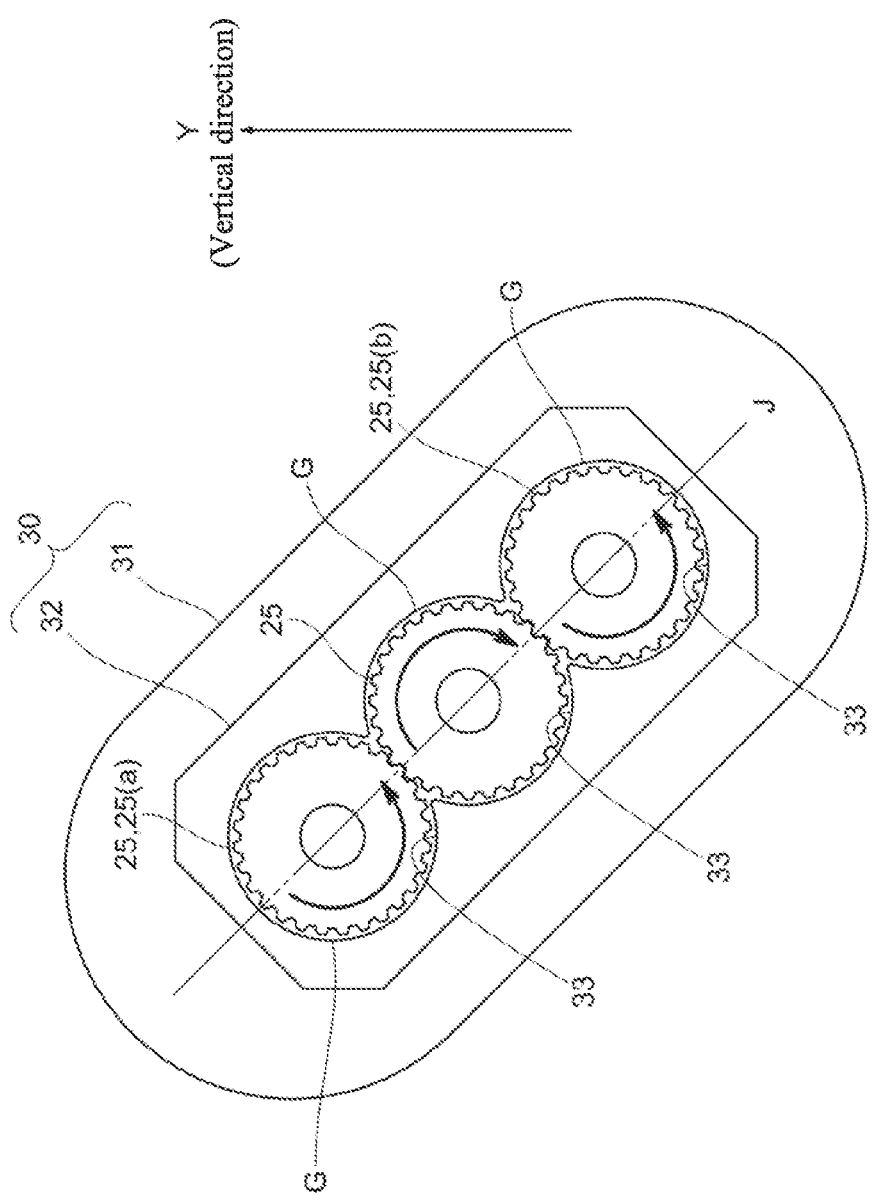
FIG. 4 is a schematic view showing a configuration of a transmission gear and a housing according to the embodiment.

More specifically, a plurality of (three in this case) transmission gears 25 are provided between the power source 21 and the reduction gear 23. As shown in FIGS. 2 and 4, these transmission gears 25 are accommodated in the housing 30.

The plurality of transmission gears 25 are arranged in a posture in which respective rotation shafts intersect with the vertical direction, and in this embodiment, the plurality of transmission gears 25 are arranged in a posture in which the rotation shafts extend along the horizontal direction. However, the transmission gear 25 may be arranged in a posture in which the rotation shaft is inclined with respect to both the vertical direction and the horizontal direction.

The plurality of transmission gears 25 are arranged in a direction intersecting the vertical direction when the holder 10 is in the upright posture. Specifically, in a state where the holder 10 is in the upright posture, an imaginary line J connecting the centers of the transmission gears 25 adjacent to each other intersects the vertical direction, and in here is inclined with respect to both the vertical direction and the horizontal direction. Although the centers of the plurality of transmission gears 25 are arranged on a straight line in this embodiment, they may be arranged on a curved line.

As shown in FIG. 2, the housing 30 is attached to the first casing C1, and specifically, as shown in FIG. 4, the housing 30 has a housing main body 31 formed with a plurality of recesses G in which each transmission gear 25 is accommodated, and an outer cover 32 for closing the recesses G. Although the housing 30 in FIG. 2 is illustrated in a state in which the inside is visible for easy understanding, the inside of the housing 30 does not necessarily have to be visible from the outside.

Each of the recesses G is a cylindrical recess having an outer diameter slightly larger than that of the transmission gear 25, and an area of an inner side surface of the recesses G including a meshing portion of the transmission gear 25 is cut out, and the recesses G communicates with each other via the cut-out.

In the above-described configuration, the transmission gear 25 of the present embodiment is coated with grease or the like as a lubricant in order to reduce wear. The lubricant splashes around the transmission gear 25 by the rotation of the transmission gear 25, and adheres to the inner peripheral surface of the recesses G. When the transmission gear 25 is stopped, the lubricant travels along the inner peripheral surface of the recesses G and is accumulated in the bottom portion 33 of the recesses G.

That is, in the housing 30 of the present embodiment, the bottom portion 33 of the recesses G functions as a reservoir portion in which lubricant such as grease is accumulated.

With this configuration, when the transmission gear 25 is rotated again, the lubricant accumulated in the accumulation portion circulates again in the housing 30, and the effect of reducing wear of the transmission gear 25 is exhibited.

Referring back to FIG. 3, a shaft member connected to one transmission gear 25(a) of the plurality of transmission gears 25 described above and interposed between the one transmission gear 25(a) and the holder 10, and a shaft member connected to another transmission gear 25(b) different from the one transmission gear 25(a) and interposed between the another transmission gear 25(b) and the power source 21, are provided on the same side with respect to the one transmission gear 25(a) and the another transmission gear 25(b).

More specifically, one transmission gear 25(a) is closest to the holder 10 among the transmission gears 25 constituting the above-described power transmission path, and the input shaft IA of the reduction gear 23 is connected to the transmission gear 25(a).

The another transmission gear 25(b) is closest to the power source 21 among the transmission gears 25 constituting the power transmission path, and the output shaft OA of the power source 21 is connected to the transmission gear 25(b).

Although the input shaft IA of the reduction gear 23 is directly connected to one transmission gear 25(a) in the present embodiment, the output shaft OA may be indirectly connected to the transmission gear 25(a) via another shaft member.

Although the output shaft OA of the power source 21 is directly connected to another transmission gear 25(b), the input shaft IA may be indirectly connected to the transmission gear 25(b) via another shaft member.

The input shaft IA connected to one transmission gear 25(a) and the output shaft OA connected to another transmission gear 25(b) are provided on the same side with respect to one transmission gear 25(a) and another transmission gear 25(b). In other words, the holder 10 and the power source 21 are provided on the same side with respect to the transmission gears 25.

However, in the present embodiment, as shown in FIG. 3, the driving device 20 further includes a first detector 26 for detecting the rotational motion of the first shaft member 24, and a control unit P for controlling the power source 21.

Here, "detecting the rotational motion of the first shaft member 24" is a concept including not only the meaning of directly detecting the rotational motion of the first shaft member 24, but also the meaning of detecting the rotational motion of a member rotating in synchronization with the first shaft member 24 as the rotational motion of the first shaft member 24.

The first detector 26 detects a rotation angle or a rotation position of the first shaft member 24 as a rotation motion, and is accommodated in the first casing C1. The first detector 26 of the present embodiment detects a change in the magnetic field caused by the rotational motion of the first shaft member 24, and is specifically a magnetic encoder, but is not necessarily limited thereto, and may be an optical, mechanical, or electromagnetic induction encoder or the like.

The control unit P is a computer including a CPU, a memory, and the like, and is accommodated in the first casing C1 described above. The control unit P is not necessarily to be accommodated in the first casing C1, and may be connected to the first detector 26 via a signal line and disposed under atmospheric pressure outside the first casing C1.

Figure 5:
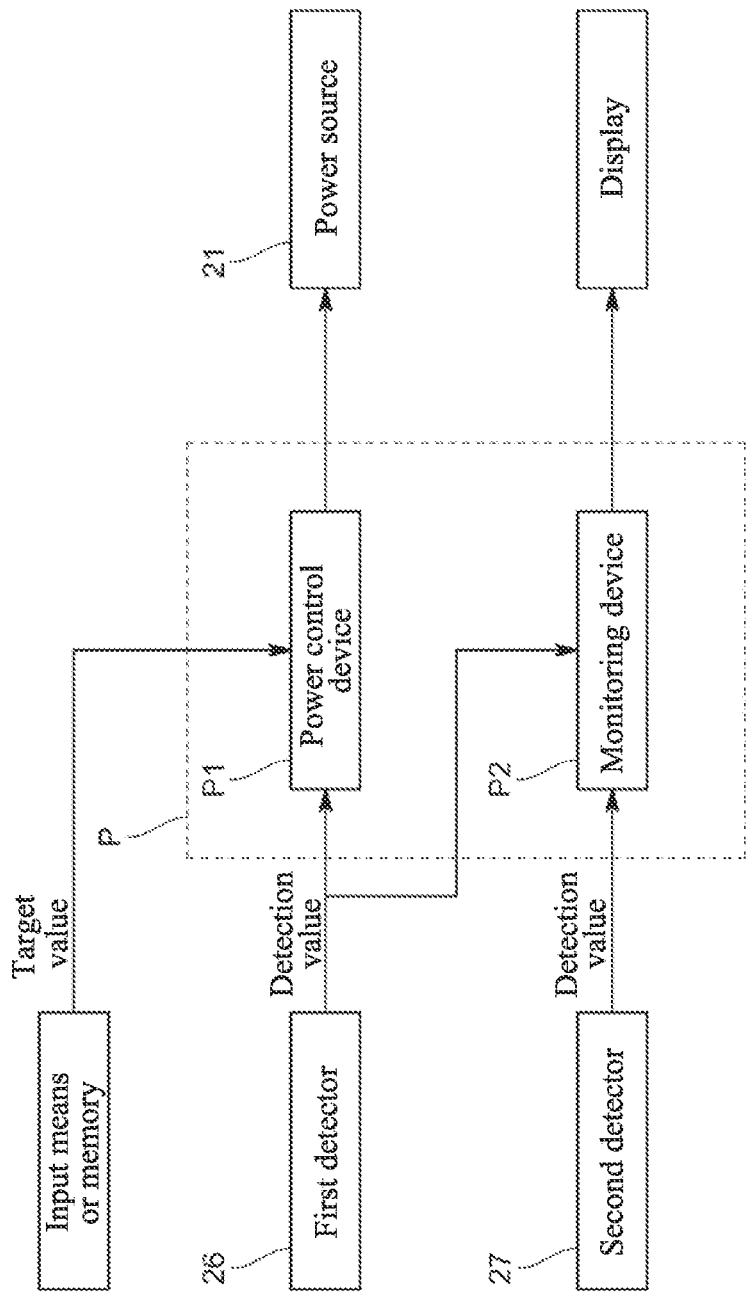
FIG. 5 is a functional block diagram showing functions of a control unit according to the embodiment.

The control unit P functions at least as a power control device P1 as shown in FIG. 5 by the cooperation of the CPU and its peripheral devices in accordance with a program stored in the memory.

The power control device P1 acquires a detection value detected by the first detector 26, and controls the power source 21 based on the detection value.

More specifically, the power control device P1 acquires the rotation angle of the first shaft member 24, that is, the rotation angle of the holder 10, as the detection value of the first detector 26, acquires the inclination of the substrate W held by the holder 10 with respect to the ion beam IB, that is, the target value of the tilt angle, and controls the servo motor as the power source 21 so that the detection value approaches the target value. The target value may be input via the input means, or may be previously stored in the memory.

As shown in FIG. 3, the driving device 20 of the present embodiment further includes a second detector 27 for detecting the rotational motion of the output shaft OA of the power source 21, and the control unit P is configured to further exert a function as a monitoring device P2 for monitoring the state of the driving device 20 as shown in FIG. 5.

Here, "detecting the rotational motion of the output shaft OA" is a concept including not only the meaning of directly detecting the rotational motion of the output shaft OA, but also the meaning of detecting the rotational motion of a member rotating in synchronization with the output shaft OA as the rotational motion of the output shaft OA.

The second detector 27 detects a rotation angle or a rotation position of the output shaft OA as a rotation motion, and is accommodated in the first casing C1.

The second detector 27 of the present embodiment detects a change in the magnetic field caused by the rotational motion of the output shaft OA, and specifically, is a magnetic encoder, and in this embodiment, a servomotor serving as the power source 21 is used. However, the second detector 27 is not necessarily limited to this, and may be an optical, mechanical, or electromagnetic induction encoder or the like, and may be provided separately from the servomotor serving as the power source 21.

The monitoring device P2 acquires the detection value of the first detector 26 and the detection value of the second detector 27, and compares them to determine whether an abnormality has occurred in the driving device 20.

Note that the "abnormality" as used herein means a state in which replacement of components of the driving device 20 or maintenance of the driving device 20 is necessary, and specifically, a state in which the gear constituting the driving device 20 is damaged, a state in which the wear amount of the gear exceeds a predetermined prescribed value, and/or the like.

The monitoring device P2 compares the detection value of the first detector 26 with the detection value of the second detector 27, calculates a difference or a ratio between the detection values, and determines that an abnormality has occurred in the driving device 20 when the calculated difference or ratio exceeds a preset threshold.

It should be noted that the monitoring device P2 may be configured such that, when it is determined that an abnormality has occurred in the driving device 20, the monitoring device P2 gives notice of such situation by displaying the abnormality on a display, or by emitting sound, light, or the like.

According to the substrate holding device 100 configured as described above, since the power from the power source 21 is transmitted to the holder 10 via the reduction gear 23, a high torque can be outputted to the holder 10 while using the small power source 21.

In addition, since the rotational motion of the first shaft member 24 rotating together with the holder 10 is detected and the power source 21 is controlled based on the detection value, the rotational motion of the first shaft member 24 can be controlled by absorbing the influence of wear of the gear provided in the power transmission path on the control and the influence of backlash on the control.

Accordingly, it is possible to reduce the influence on the control of the above-described gear wear, backlash, and the like while achieving miniaturization of the motor, and it is possible to precisely control the inclination of the substrate W with respect to the ion beam IB.

Further, since the plurality of transmission gears 25 interposed between the power source 21 and the first shaft member 24 are interposed, for example, by changing the number or arrangement of the transmission gears 25, the arrangement of the power source 21 can be changed, and the degree of freedom in arrangement can be improved. As a result, for example, by arranging the power source 21 away from the holder 10, the influence of the magnetic field generated by the motor serving as the power source 21 on the electrons from the PFG 103 can be reduced. Moreover, as described above, the influence of wear of the transmission gear 25 on the control, the influence of backlash on the control, and the like can be absorbed, so that the operation and effect of the present invention can be more significantly exhibited.

When electrons supplied from the PFG 103 are influenced by a magnetic field generated from the power source 21, the effect of suppressing charge-up on the surface of the substrate is reduced, thereby affecting neutralization of the surface of the substrate W.

Further, since the shaft member connected to one transmission gear 25(a) and interposed between the one transmission gear 25(a) and the holder 10 and the shaft member connected to another transmission gear 25(b) and interposed between the another transmission gear 25(b) and the power source 21 are provided on the same side with respect to the one transmission gear 25(a) and the another transmission gear 25(b) by utilizing the improvement of the degree of freedom of arrangement, the holder 10 and the power source 21 can be arranged on the same side with respect to the transmission gears 25.

As a result, compared with the configuration in which the power source 21 is arranged on the opposite side of the holder 10 with respect to the transmission gears 25, the device can be kept compact, and the number of portions to be cleaned can be reduced, thereby improving maintainability.

Since the plurality of transmission gears 25 are accommodated in the housing 30, it is possible to prevent lubricant such as grease used for the transmission gears 25 from scattering out of the housing 30, and it is possible to reduce contamination of, for example, the first detector 26 and the second detector 27 due to the lubricant.

Further, since the plurality of transmission gears 25 are arranged in a direction intersecting with the vertical direction, the rotation axes of the transmission gears 25 intersect with the vertical direction, and each of the transmission gears 25 is accommodated in the recesses G formed in the housing 30, the lubricant splashed around the transmission gears 25 due to the rotation of the transmission gears 25 adheres to the inner peripheral surface of the recesses G, and after the transmission gears 25 stop, the lubricant travels through the inner peripheral surface of the recesses G and be accumulated in the bottom portion 33 of the recesses G. When the transmission gears 25 rotate again, the lubricant accumulated in the bottom portion 33 of the recesses G circulates again in the housing 30, so that the effect of reducing wear of the transmission gears 25 is exhibited.

Since the monitoring device P2 for determining whether or not an abnormality has occurred in the driving device 20 is provided, for example, it is possible to monitor the timing of replacement of the gear due to damage of the gear or wear amount exceeding a prescribed value.

Since the first detector 26 and the second detector 27 are magnetic encoders, detection accuracy can be ensured even if grease adheres to these detectors, for example, as compared with the case where an optical detector is used.

Since the first casing C1 is partitioned from the third casing C3 by the seal member provided around the first shaft member 24, and the inside of the first casing C1 is communicated with the atmosphere, it is not necessary to use special devices for vacuum as the first detector 26, the second detector 27, and the power source 21, and a general-purpose device can be used.

The present invention is not limited to the above embodiments.

For example, although a plurality of transmission gears 25 are interposed between the power source 21 and the first shaft member 24 in the above embodiment, an endless belt or the like may be interposed instead of or in addition to the transmission gears 25.

Although the power source 21 is disposed on the holder 10 side with respect to the transmission gears 25 in the above embodiment, the power source 21 may be disposed on the side opposite to the holder 10 with respect to the transmission gears 25.

The power control device P1 of the above-described embodiment is configured to compare the detection value of the first detector 26 with the target value and control the power source 21 so that the detection value approaches the target value, and in such a configuration, the tilt angle as the rotation angle of the holder 10 can be accurately controlled, while the control time may be long.

Therefore, the power control device P1 may be configured to compare the detection value of the first detector 26 with a predetermined target range to determine whether the detection value is within the target range. When the detection value does not fall within the target range, the power control device P1 may be configured to control the power source 21 based on the detection value. Specifically, an example may be that the power control device P1 controls the power source 21 based on the difference between the detection value and the upper or lower limit of the target range.

Even though the control accuracy of the tilt angle of the holder 10 is slightly inferior, such configuration is still advantageous in terms of throughput as the control time is shortened.

Further, the power control device P1 may be configured to be switchable between a first mode in which the detection value and the target value are compared with emphasis on the control accuracy of the tilt angle, and a second mode in which the detection value and the target range are compared with emphasis on the throughput.

Further, although the monitoring device P2 compares the detection value of the first detector 26 with the detection value of the second detector 27 in the above-described embodiment, the monitoring device P2 may be configured to determine whether an abnormality has occurred in the driving device 20 based on the detection value of the first detector 26 and, for example, the amount of power supplied to the power source 21.

The present invention is not limited to the above-described embodiments, and various modifications can be made without departing from the spirit and scope of the present invention.

What is claimed is:

1. A substrate holding device comprising:
   a holder that holds a substrate irradiated with an ion beam; and
   a driving device that rotates the holder around a predetermined axis to change an inclination of the held substrate with respect to the ion beam,
   wherein the driving device comprises:
      a power source that outputs power to rotate the holder;
      a reduction gear provided in the middle of a power transmission path from the power source to the holder;
      a first shaft member that rotates together with the holder by a power outputted from the reduction gear;
      a first detector that detects a rotational motion of the first shaft member; and
      a power control device that controls the power source by comparing a detection value of the first detector with a predetermined target range,
   wherein the power control device controls the power source based on the detection value when the detection value is out of the predetermined target range.

2. The substrate holding device according to claim 1, further comprising
   a plurality of transmission gears interposed between the power source and the first shaft member.

3. A substrate holding device comprising:
   a holder that holds a substrate irradiated with an ion beam; and
   a driving device that rotates the holder around a predetermined axis to change an inclination of the held substrate with respect to the ion beam,
   wherein the driving device comprises:
      a power source that outputs power to rotate the holder;
      a reduction gear provided in the middle of a power transmission path from the power source to the holder;
      a first shaft member that rotates together with the holder by a power outputted from the reduction gear;
      a first detector that detects a rotational motion of the first shaft member;
      a power control device that controls the power source based on a detection value of the first detector; and
      a plurality of transmission gears interposed between the power source and the first shaft member, wherein
   a shaft member connected to one of the transmission gears and interposed between the one of the transmission gears, and the holder and a shaft member connected to another of the transmission gears different from the one of the transmission gears and interposed between the another of the transmission gears and the power source are provided on the same side with respect to the one of the transmission gears and the another of the transmission gears.

4. A substrate holding device comprising:
   a holder that holds a substrate irradiated with an ion beam; and
   a driving device that rotates the holder around a predetermined axis to change an inclination of the held substrate with respect to the ion beam,
   wherein the driving device comprises:
      a power source that outputs power to rotate the holder;
      a reduction gear provided in the middle of a power transmission path from the power source to the holder;
      a first shaft member that rotates together with the holder by a power outputted from the reduction gear;
      a first detector that detects a rotational motion of the first shaft member;
      a power control device that controls the power source based on a detection value of the first detector; and a plurality of transmission gears interposed between the power source and the first shaft member, wherein in a configuration in which the plurality of transmission gears are arranged in a direction intersecting with a vertical direction and the rotation axes of the transmission gears intersect with the vertical direction, the substrate holding device further comprises a housing having a plurality of recesses that accommodates the plurality of transmission gears.

5. A substrate holding device comprising:

a holder that holds a substrate irradiated with an ion beam; and a driving device that rotates the holder around a predetermined axis to change an inclination of the held substrate with respect to the ion beam, wherein the driving device comprises:
- a power source that outputs power to rotate the holder;
- a reduction gear provided in the middle of a power transmission path from the power source to the holder;
- a first shaft member that rotates together with the holder by a power outputted from the reduction gear;
- a first detector that detects a rotational motion of the first shaft member;
- a power control device that controls the power source based on a detection value of the first detector;
- a second detector that detects a rotational motion of an output shaft of the power source; and
- a monitoring device that compares the detection value of the first detector with a detection value of the second detector to determine whether an abnormality has occurred in the driving device.

6. A substrate holding device comprising:

a holder that holds a substrate irradiated with an ion beam; and a driving device that rotates the holder around a predetermined axis to change an inclination of the held substrate with respect to the ion beam, wherein the driving device comprises:
- a power source that outputs power to rotate the holder;
- a reduction gear provided in the middle of a power transmission path from the power source to the holder;
- a first shaft member that rotates together with the holder by a power outputted from the reduction gear;
- a first detector that detects a rotational motion of the first shaft member; and
- a power control device that controls the power source based on a detection value of the first detector; wherein the first detector detects a change in a magnetic field caused by the rotational motion of the first shaft member.

* * * * *